United States Patent
Liu et al.

(10) Patent No.: US 10,483,379 B2
(45) Date of Patent: Nov. 19, 2019

(54) HIGH RESISTIVITY SILICON-ON-INSULATOR WAFER MANUFACTURING METHOD FOR REDUCING SUBSTRATE LOSS

(71) Applicant: SunEdison Semiconductor Limited (UEN201334164H), Singapore (SG)

(72) Inventors: Qingmin Liu, Glen Carbon, IL (US); Gang Wang, Grover, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 79 days.

(21) Appl. No.: 15/867,860

(22) Filed: Jan. 11, 2018

(65) Prior Publication Data

US 2018/0138298 A1    May 17, 2018

Related U.S. Application Data

(62) Division of application No. 14/835,086, filed on Aug. 25, 2015, now Pat. No. 9,899,499.

(Continued)

(51) Int. Cl.
*H01L 29/66* (2006.01)
*H01L 21/763* (2006.01)
(Continued)

(52) U.S. Cl.
CPC .... *H01L 29/66833* (2013.01); *H01L 21/0254* (2013.01); *H01L 21/02381* (2013.01);
(Continued)

(58) Field of Classification Search
CPC ..... H01L 21/762; H01L 21/02; H01L 21/324; H01L 27/12; H01L 29/06
See application file for complete search history.

(56) References Cited

U.S. PATENT DOCUMENTS

| 4,501,060 A | 2/1985 | Frye et al. |
| 4,755,865 A | 7/1988 | Wilson et al. |
| (Continued) | | |

FOREIGN PATENT DOCUMENTS

| EP | 0939430 A2 | 1/1999 |
| EP | 2426701 A1 | 7/2012 |
| (Continued) | | |

OTHER PUBLICATIONS

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.
(Continued)

*Primary Examiner* — Seahvosh Nikmanesh
(74) *Attorney, Agent, or Firm* — Armstrong Teasdale LLP (57) ABSTRACT

A multilayer composite structure and a method of preparing a multilayer composite structure are provided. The multilayer composite structure comprises a semiconductor handle substrate having a minimum bulk region resistivity of at least about 500 ohm-cm; a semiconductor nitride layer in contact with the semiconductor handle substrate, the semiconductor nitride layer selected from the group consisting of aluminum nitride, boron nitride, indium nitride, gallium nitride, aluminum gallium nitride, aluminum gallium indium nitride, aluminum gallium indium boron nitride, and combinations thereof; a dielectric layer in contact with the semiconductor nitride layer; and a semiconductor device layer in contact with the dielectric layer.

24 Claims, 3 Drawing Sheets

Related U.S. Application Data (60) Provisional application No. 62/045,602, filed on Sep. 4, 2014.

(51) Int. Cl.

| | |
|---|---|
| *H01L 21/02* | (2006.01) |
| *H01L 29/20* | (2006.01) |
| *H01L 21/304* | (2006.01) |
| *H01L 21/324* | (2006.01) |
| *H01L 29/792* | (2006.01) |
| *H01L 29/205* | (2006.01) |
| *H01L 29/423* | (2006.01) |
| *H01L 29/51* | (2006.01) |
| *H01L 21/762* | (2006.01) |

(52) U.S. Cl.
CPC .. *H01L 21/02428* (2013.01); *H01L 21/02598* (2013.01); *H01L 21/304* (2013.01); *H01L 21/324* (2013.01); *H01L 21/763* (2013.01); *H01L 21/76254* (2013.01); *H01L 29/2003* (2013.01); *H01L 29/205* (2013.01); *H01L 29/4234* (2013.01); *H01L 29/517* (2013.01); *H01L 29/518* (2013.01); *H01L 29/792* (2013.01)

(56) References Cited

U.S. PATENT DOCUMENTS

| | | | |
|---|---|---|---|
| 4,968,384 | A | 11/1990 | Asano |
| 5,189,500 | A | 2/1993 | Kusunoki |
| 6,043,138 | A | 3/2000 | Ibok |
| 6,346,459 | B1 | 2/2002 | Usenko et al. |
| 6,373,113 | B1 | 4/2002 | Gardner et al. |
| 6,562,127 | B1 | 5/2003 | Kud et al. |
| 6,624,047 | B1 | 9/2003 | Sakaguchi et al. |
| 7,868,419 | B1 | 1/2011 | Kerr et al. |
| 7,879,699 | B2 | 2/2011 | Schulze et al. |
| 7,915,706 | B1 | 3/2011 | Kerr et al. |
| 8,058,137 | B1 | 11/2011 | Or-Bach et al. |
| 8,076,750 | B1 | 12/2011 | Kerr et al. |
| 8,466,036 | B2 | 6/2013 | Brindle et al. |
| 8,481,405 | B2 | 7/2013 | Arriagada et al. |
| 8,796,116 | B2 | 8/2014 | Grabbe et al. |
| 8,846,493 | B2 | 9/2014 | Libbert et al. |
| 8,859,393 | B2 | 10/2014 | Ries et al. |
| 9,202,711 | B2 | 12/2015 | Liu et al. |
| 9,899,499 | B2* | 2/2018 | Liu ............... H01L 21/02381 |
| 10,312,134 | B2* | 6/2019 | Liu ............... H01L 21/02112 |
| 2002/0090758 | A1 | 7/2002 | Henley et al. |
| 2004/0005740 | A1 | 1/2004 | Lochtefeld et al. |
| 2004/0031979 | A1 | 2/2004 | Lochtefeld et al. |
| 2004/0108537 | A1 | 6/2004 | Tiwari |
| 2005/0153524 | A1 | 7/2005 | Maa et al. |
| 2006/0030124 | A1 | 2/2006 | Maa et al. |
| 2006/0033110 | A1 | 2/2006 | Alam et al. |
| 2006/0226482 | A1 | 10/2006 | Suvorov |
| 2007/0032040 | A1 | 2/2007 | Lederer |
| 2007/0054466 | A1 | 3/2007 | Hebras |
| 2009/0004833 | A1 | 1/2009 | Suzuki et al. |
| 2009/0014828 | A1 | 1/2009 | Mizushima et al. |
| 2009/0087631 | A1 | 4/2009 | Schulze et al. |
| 2009/0092810 | A1 | 4/2009 | Lee et al. |
| 2009/0236689 | A1* | 9/2009 | Daly ............... H01L 23/5227 257/531 |
| 2009/0321829 | A1 | 12/2009 | Nguyen et al. |
| 2010/0044718 | A1 | 2/2010 | Hanser et al. |
| 2010/0248459 | A1* | 9/2010 | Makabe ............ C23C 16/303 438/478 |
| 2011/0174362 | A1 | 7/2011 | Tanner et al. |
| 2011/0298083 | A1 | 12/2011 | Yoneda |
| 2012/0091587 | A1 | 4/2012 | Or-Bach et al. |
| 2012/0161310 | A1 | 6/2012 | Brindle et al. |
| 2012/0234887 | A1* | 9/2012 | Henley ............ H01L 21/67092 225/1 |
| 2012/0238070 | A1 | 9/2012 | Libbert et al. |
| 2012/0267681 | A1 | 10/2012 | Nemoto et al. |
| 2012/0280253 | A1* | 11/2012 | Sung ............... H01L 23/3732 257/77 |
| 2013/0120951 | A1 | 5/2013 | Zuo et al. |
| 2013/0122672 | A1 | 5/2013 | Or-Bach et al. |
| 2013/0168835 | A1 | 7/2013 | Botula et al. |
| 2013/0193445 | A1 | 8/2013 | Dennard et al. |
| 2013/0237032 | A1* | 9/2013 | Zhang ............... H01L 21/2007 438/459 |
| 2013/0240830 | A1 | 9/2013 | Seacrist et al. |
| 2013/0242627 | A1 | 9/2013 | Bedell et al. |
| 2013/0294038 | A1 | 11/2013 | Landru et al. |
| 2013/0344680 | A1 | 12/2013 | Arriagada et al. |
| 2014/0042598 | A1 | 2/2014 | Kitada et al. |
| 2014/0070215 | A1 | 3/2014 | Bedell et al. |
| 2014/0084290 | A1 | 3/2014 | Allibert et al. |
| 2014/0120654 | A1 | 5/2014 | Fujii et al. |
| 2014/0124902 | A1 | 5/2014 | Botula et al. |
| 2014/0273405 | A1 | 9/2014 | Liu et al. |
| 2015/0004778 | A1 | 1/2015 | Botula et al. |
| 2015/0115480 | A1 | 4/2015 | Peidous et al. |

FOREIGN PATENT DOCUMENTS

| | | |
|---|---|---|
| JP | 2012253364 A | 12/2012 |
| WO | 2009120407 A2 | 10/2009 |
| WO | 2012127006 A1 | 9/2012 |

OTHER PUBLICATIONS

Lederer, D. et al., Enhanced High resistivity SOI wafers for RF Applications, 2004, IEEE International SOI Conference, Oct. 2004, pp. 46-47.

Lederer D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE International SOI Conference Proceedings, 2006, pp. 29-30.

Kerr, Daniel C., Identification of RF harmonic distortion of Si substrates and its reduction using a trap-rich layer, IEEE (IEEE Topical Meeting), 2008, pp. 151-154.

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

Zamir, S. et al., Reduction of cracks in GaN films on Si-on-insulator by lateral confined epitaxy, Journal of Crystal Growth, Elsevier Amsterdam, NL, Sep. 2002, pp. 375-380, vol. 243, No. 3-4.

Gao, Min, et al., A transmission electron microscopy study of microstructural defects in proton implanted silicon, Journal of Applied Physics, Oct. 15, 1996 American Institute of Physcis, pp. 4767-4769, vol. 70, No. 8.

Gao, Min, et al., Two-dimensional network of dislocations and nanocavities in hydrogen-implanted and two-step annealed silicon, Applied Physcis Letters, American Institute of Physics May 18, 1998, pp. 2544-2546 vol. 72, No. 20.

International Search Report and Written Opinion of the International Searching Authority regarding PCT/US2015/050299 dated Dec. 3, 2015, pp. 1-14.

\* cited by examiner

HIGH RESISTIVITY SILICON-ON-INSULATOR WAFER MANUFACTURING METHOD FOR REDUCING SUBSTRATE LOSS

CROSS REFERENCE TO RELATED APPLICATION(S)

This application is a divisional application of U.S. application Ser. No. 14/835,086, which was filed Aug. 25, 2015, which is hereby incorporated by reference as if set forth in its entirety. U.S. application Ser. No. 14/835,086 claims the benefit of provisional application Ser. No. 62/045,602, filed Sep. 4, 2014, which is hereby incorporated by reference as if set forth in its entirety.

FIELD OF THE INVENTION

The present invention generally relates to the field of semiconductor wafer manufacture. More specifically, the present invention relates to a method for producing a semiconductor-on-insulator (e.g., silicon-on-insulator) structure, and more particularly to a method for producing a charge trapping layer in the handle wafer of the semiconductor-on-insulator structure.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, or gallium arsenide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick. In general, composite layer structures, such as silicon-on-insulator (SOI), silicon-on-sapphire (SOS), and silicon-on-quartz, are produced by placing two wafers in intimate contact, followed by a thermal treatment to strengthen the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The wafers are then pressed together, and a bond is formed there between. This bond is relatively weak, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of a crack along the cleave plane, thus separating a portion of the donor wafer. This method allows for better uniformity of the transferred layer and allows recycle of the donor wafer, but typically requires heating the implanted and bonded pair to temperatures approaching 500° C.

Figure 1:
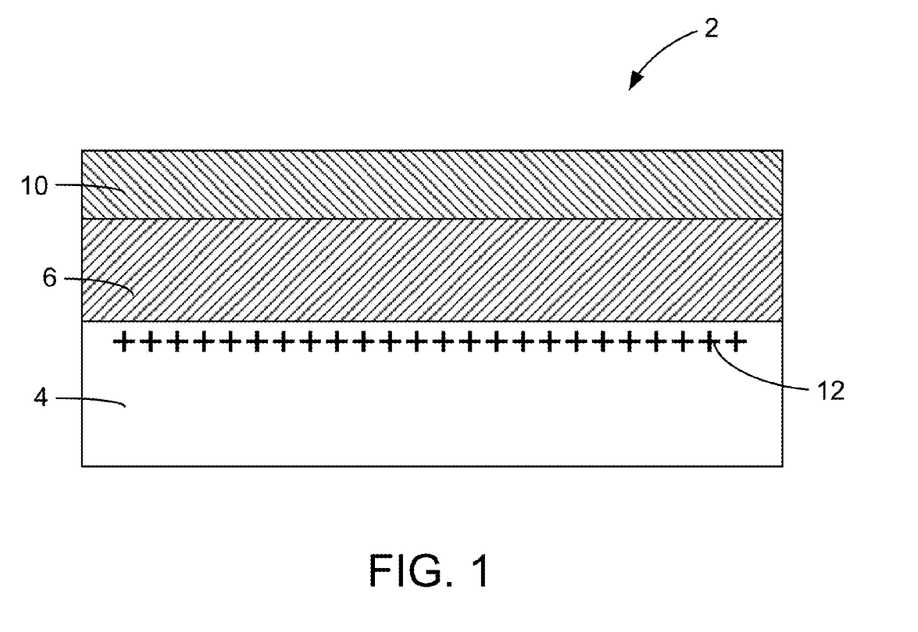
FIG. 1 is a depiction of a silicon-on-insulator wafer comprising a high resistivity substrate and a buried oxide layer.

The use of high resistivity semiconductor-on-insulator (e.g., silicon-on-insulator) wafers for RF related devices such as antenna switches offers benefits over traditional substrates in terms of cost and integration. To reduce parasitic power loss and minimize harmonic distortion inherent when using conductive substrates for high frequency applications it is necessary, but not sufficient, to use substrate wafers with a high resistivity. Accordingly, the resistivity of the handle wafer for an RF device is generally greater than about 500 Ohm-cm. With reference now to FIG. 1, a silicon on insulator structure 2 comprising a very high resistivity silicon wafer 4, a buried oxide (BOX) layer 6, and a silicon device layer 10. Such a substrate is prone to formation of high conductivity charge inversion or accumulation layers 12 at the BOX/handle interface causing generation of free carriers (electrons or holes), which reduce the effective resistivity of the substrate and give rise to parasitic power losses and device nonlinearity when the devices are operated at RF frequencies. These inversion/accumulation layers can be due to BOX fixed charge, oxide trapped charge, interface trapped charge, and even DC bias applied to the devices themselves.

Figure 2:
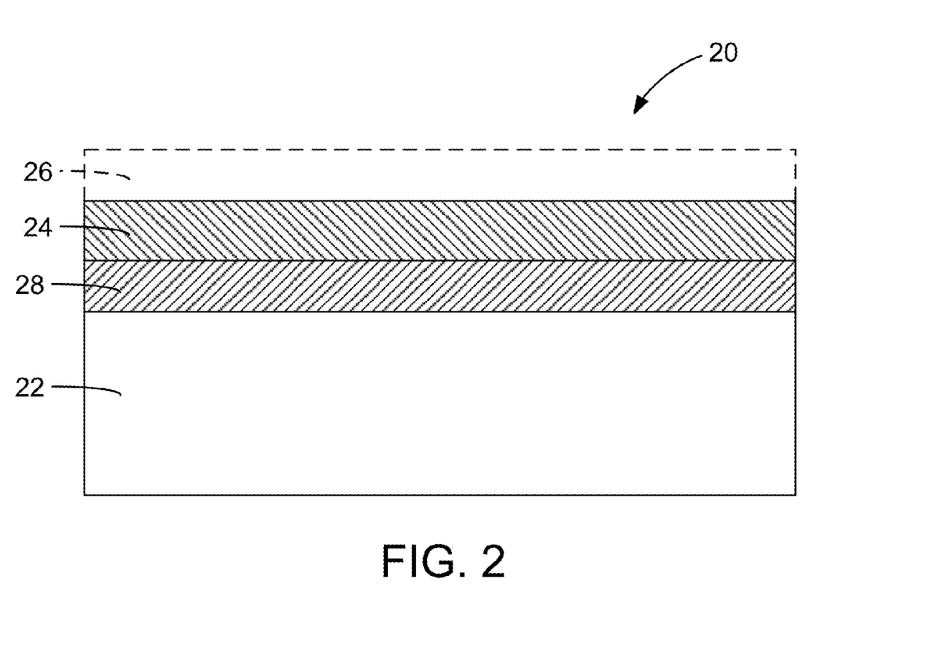
FIG. 2 is a depiction of a silicon-on-insulator wafer according to the prior art, the SOI wafer comprising a polysilicon charge trapping layer between a high resistivity substrate and a buried oxide layer.

A method is required therefore to trap the charge in any induced inversion or accumulation layers so that the high resistivity of the substrate is maintained even in the very near surface region. It is known that charge trapping layers (CTL) between the high resistivity handle substrates and the buried oxide (BOX) may improve the performance of RF devices fabricated using SOI wafers. A number of methods have been suggested to form these high interface trap layers. For example, with reference now to FIG. 2, one of the method of creating a semiconductor-on-insulator 20 (e.g., a silicon-on-insulator, or SOI) with a CTL for RF device applications is based on depositing an undoped polycrystalline silicon film 28 on a silicon substrate having high resistivity 22 and then forming a stack of oxide 24 and top silicon layer 26 on it. A polycrystalline silicon layer 28 acts as a high defectivity layer between the silicon substrate 22 and the buried oxide layer 24. See FIG. 2, which depicts a polycrystalline silicon film for use as a charge trapping layer 28 between a high resistivity substrate 22 and the buried oxide layer 24 in a silicon-on-insulator structure 20. An alternative method is the implantation of heavy ions to create a near surface damage layer. Devices, such as radiofrequency devices, are built in the top silicon layer 26.

It has been shown in academic studies that the polycrystalline silicon layer in between of the oxide and substrate improves the device isolation, decreases transmission line losses and reduces harmonic distortions. See, for example: H. S. Gamble, et al. "Low-loss CPW lines on surface stabilized high resistivity silicon," *Microwave Guided Wave Lett.*, 9(10), pp. 395-397, 1999; D. Lederer, R. Lobet and J.-P. Raskin, "Enhanced high resistivity SOI wafers for RF applications," *IEEE Intl. SOI Conf*, pp. 46-47, 2004; D. Lederer and J.-P. Raskin, "New substrate passivation method dedicated to high resistivity SOI wafer fabrication with increased substrate resistivity," *IEEE Electron Device Letters*, vol. 26, no. 11, pp. 805-807, 2005; D. Lederer, B. Aspar, C. Laghaé and J.-P. Raskin, "Performance of RF passive structures and SOI MOSFETs transferred on a passivated HR SOI substrate," *IEEE International SOI Conference*, pp. 29-30, 2006; and Daniel C. Kerr et al. "Identification of RF harmonic distortion on Si substrates and its reduction using a trap-rich layer", Silicon Monolithic Integrated Circuits in RF Systems, 2008. SiRF 2008 (IEEE Topical Meeting), pp. 151-154, 2008.

SUMMARY OF THE INVENTION

Among the provisions of the present invention may be noted a multilayer structure comprising: a semiconductor handle substrate comprising two major, generally parallel surfaces, one of which is a front surface of the semiconductor handle substrate and the other of which is a back surface of the semiconductor handle substrate, a circumferential edge joining the front and back surfaces of the semiconductor handle substrate, and a bulk region between the front and back surfaces of the semiconductor handle substrate, wherein the semiconductor handle substrate has a minimum bulk region resistivity of at least about 500 ohm-cm; a semiconductor nitride layer in contact with the front surface of the semiconductor handle substrate, the semiconductor nitride layer selected from the group consisting of aluminum nitride, boron nitride, indium nitride, gallium nitride, aluminum gallium nitride, aluminum gallium indium nitride, aluminum gallium indium boron nitride, and combinations thereof; a dielectric layer in contact with the semiconductor nitride layer; and a semiconductor device layer in contact with the dielectric layer.

The present invention is further directed to a method of forming a multilayer structure, the method comprising: forming a semiconductor nitride layer on a front surface of a semiconductor handle substrate, wherein the semiconductor nitride layer is selected from the group consisting of aluminum nitride, boron nitride, indium nitride, gallium nitride, aluminum gallium nitride, aluminum gallium indium nitride, aluminum gallium indium boron nitride, and combinations thereof and wherein the semiconductor handle substrate comprises two major, generally parallel surfaces, one of which is the front surface of the semiconductor handle substrate and the other of which is a back surface of the semiconductor handle substrate, a circumferential edge joining the front and back surfaces of the semiconductor handle substrate, and a bulk region between the front and back surfaces of the semiconductor handle substrate, wherein the semiconductor handle substrate has a minimum bulk region resistivity of at least about 500 ohm-cm; and bonding a front surface of a semiconductor donor substrate to the semiconductor nitride layer to thereby form a bonded structure, wherein the semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate, and further wherein the front surface of the semiconductor donor substrate comprises a dielectric layer.

Other objects and features will be in part apparent and in part pointed out hereinafter.

DETAILED DESCRIPTION OF THE EMBODIMENT(S) OF THE INVENTION

According to the present invention, a method is provided for preparing a semiconductor-on-insulator composite structure comprising a wide bandgap layer comprising a semiconductor nitride, e.g., a Group IIIA nitride, on a semiconductor handle substrate, e.g., a single crystal semiconductor handle wafer, such as a single crystal silicon handle wafer. The present invention is further directed to a semiconductor handle wafer comprising a wide bandgap layer on a surface thereof. The single crystal semiconductor handle wafer comprising the wide bandgap layer is useful in the production of a semiconductor-on-insulator (e.g., silicon-on-insulator) structure. The present invention is thus further directed to a semiconductor-on-insulator composite structure comprising a semiconductor handle wafer comprising a wide bandgap layer comprising a semiconductor nitride, e.g., a Group IIIA nitride. The wide bandgap layer comprising the Group IIIA nitride is located at the interface of the semiconductor handle wafer and the dielectric layer, e.g., a buried oxide, or BOX layer, which itself interfaces with a semiconductor device layer.

According to the present invention, the wide bandgap layer is formed on a surface of a semiconductor handle substrate, e.g., a single crystal semiconductor handle wafer, such as a single crystal silicon handle wafer, at the region near the oxide interface. The incorporation of a wide bandgap layer at the region near the high resistivity semiconductor wafer-buried oxide interface is advantageous since defects in wide band gap materials tend to have deep energy levels. The carriers that are trapped deep in the bandgap require more energy to be released, which enhances the effectiveness of a wide bandgap layer as a charge trapping layer. Wide bandgap layer materials include Group IIIA (boron group, or icosagens) nitrides. Such materials may be selected from among aluminum nitride, boron nitride, indium nitride, gallium nitride, aluminum gallium nitride, aluminum gallium indium nitride, aluminum gallium indium boron nitride, and combinations thereof.

Figure 3:
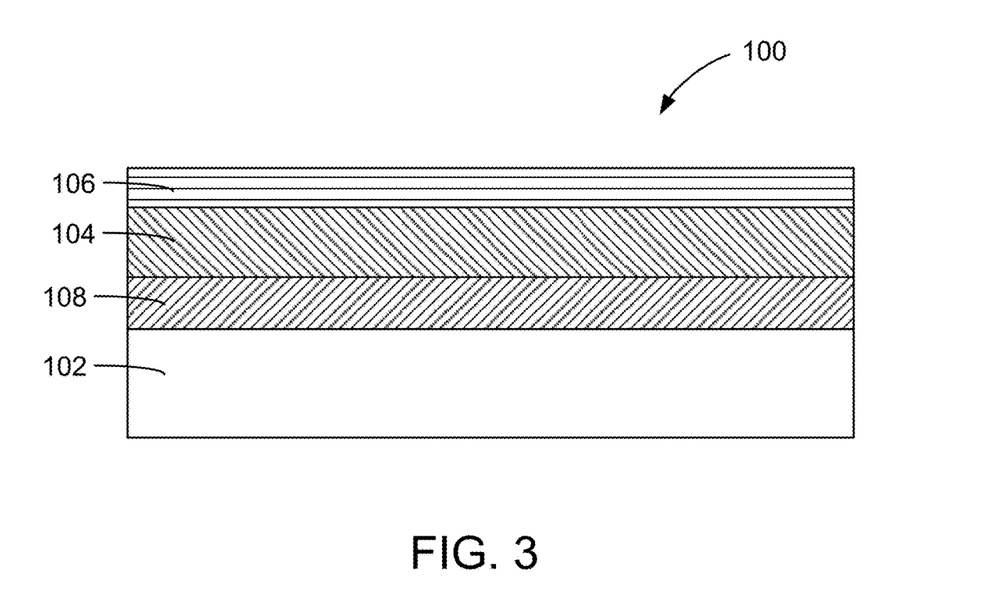
FIG. 3 is a depiction of a high resistivity silicon-on-insulator composite structure with an embedded wide bandgap layer.

The substrates for use in the present invention include a semiconductor handle substrate, e.g., a single crystal semiconductor handle wafer, and a semiconductor donor substrate, e.g., a single crystal semiconductor donor wafer. FIG. 3 is a depiction of an exemplary, non-limiting high resistivity silicon-on-insulator composite structure with an embedded wide bandgap layer. The semiconductor device layer 106 in a semiconductor-on-insulator composite structure 100 is derived from the single crystal semiconductor donor wafer. The semiconductor device layer 106 may be transferred onto the semiconductor handle substrate 102 by wafer thinning techniques such as etching a semiconductor donor substrate or by cleaving a semiconductor donor substrate comprising a damage plane. In general, the single crystal semiconductor handle wafer and single crystal semiconductor donor wafer comprise two major, generally parallel surfaces. One of the parallel surfaces is a front surface of the substrate, and the other parallel surface is a back surface of the substrate. The substrates comprise a circumferential edge joining the front and back surfaces, and a central plane between the front and back surfaces. The substrates additionally comprise an imaginary central axis perpendicular to the central plane and a radial length that extends from the central axis to the circumferential edge. In addition, because semiconductor substrates, e.g., silicon wafers, typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

Prior to any operation as described herein, the front surface and the back surface of the substrate may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle substrate 102, e.g., a single crystal silicon handle wafer, refers to the major surface of the substrate that becomes an interior surface of the bonded structure. It is upon this front surface that the wide bandgap layer 108 is formed. Accordingly, a "back surface" of a single crystal semiconductor handle substrate, e.g., a handle wafer, refers to the major surface that becomes an exterior surface of the bonded structure. Similarly, a "front surface" of a single crystal semiconductor donor substrate, e.g., a single crystal silicon donor wafer, refers to the major surface of the single crystal semiconductor donor substrate that becomes an interior surface of the bonded structure, and a "back surface" of a single crystal semiconductor donor substrate, e.g., a single crystal silicon donor wafer, refers to the major surface that becomes an exterior surface of the bonded structure. Upon completion of conventional bonding and wafer thinning steps, the single crystal semiconductor donor substrate forms the semiconductor device layer 106 of the semiconductor-on-insulator (e.g., silicon-on-insulator) composite structure.

The single crystal semiconductor handle substrate and the single crystal semiconductor donor substrate may be single crystal semiconductor wafers. In preferred embodiments, the semiconductor wafers comprise a material selected from the group consisting of silicon, silicon carbide, silicon germanium, gallium arsenide, gallium nitride, indium phosphide, indium gallium arsenide, germanium, and combinations thereof. The single crystal semiconductor wafers, e.g., the single crystal silicon handle wafer and single crystal silicon donor wafer, of the present invention typically have a nominal diameter of at least about 150 mm, at least about 200 mm, at least about 300 mm, at least about 450 mm, or more. Wafer thicknesses may vary from about 250 micrometers to about 1500 micrometers, suitably within the range of about 500 micrometers to about 1000 micrometers.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, at least about 450 mm, or more. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, suitably within the range of about 500 micrometers to about 1000 micrometers. In some specific embodiments, the wafer thickness may be about 725 micrometers.

In some embodiments, the single crystal semiconductor wafers, i.e., handle wafer and donor wafer, comprise interstitial oxygen in concentrations that are generally achieved by the Czochralski-growth method. In some embodiments, the semiconductor wafers comprise oxygen in a concentration between about 4 PPMA and about 18 PPMA. In some embodiments, the semiconductor wafers comprise oxygen in a concentration between about 10 PPMA and about 35 PPMA. Interstitial oxygen may be measured according to SEMI MF 1188-1105.

In some embodiments, the semiconductor handle substrate 102, e.g., a single crystal semiconductor handle substrate, such as a single crystal silicon handle wafer, has a relatively high minimum bulk resistivity. High resistivity wafers are generally sliced from single crystal ingots grown by the Czochralski method or float zone method. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 100 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

In some embodiments, the front surface of the semiconductor handle substrate 102 is cleaned to remove all oxide prior to formation of the wide bandgap layer such that the front surface of the wafer lacks even a native oxide layer. The native oxide may be removed by standard etching techniques. In some embodiments, the semiconductor wafer may be subjected to a vapor phase HCl etch process in a horizontal flow single wafer epitaxial reactor using $H_2$ as a carrier gas.

In some embodiments, a wide bandgap layer 108 is deposited on the front surface of the semiconductor handle substrate 102, e.g., a wafer. Wide bandgap layer materials include semiconductor nitrides, e.g., Group IIIA (boron group, or icosagens) nitrides. Group IIIA elements comprise aluminum, boron, indium, and gallium. Accordingly, Group IIIA nitrides may be selected from among aluminum nitride, boron nitride, indium nitride, gallium nitride, aluminum gallium nitride, aluminum gallium indium nitride, aluminum gallium indium boron nitride, and combinations thereof. The Group IIIA material may be crystalline or amorphous. The layer of wide bandgap material deposited on the front surface of the handle wafer may comprise multiple layers of Group IIIA nitrides, and each layer may comprise the same material, or different materials. The wide bandgap materials of the present invention may be deposited by metalorganic chemical vapor deposition (MOCVD), physical vapor deposition (PVD), chemical vapor deposition (CVD), or molecular beam epitaxy (MBE). In some preferred embodiments, the wide bandgap materials of the present invention may be deposited by metalorganic chemical vapor deposition (MOCVD). In some embodiments, MOCVD may be carried out in a commercially available instrument suitable for MOCVD, such as the Veeco Turbodisc K465i or the Aixtron G5. MOCVD is particularly preferred since it enables higher growth temperature, better uniformity, and lower surface roughness. In MOCVD, gaseous precursors are injected into a reactor, and the reaction between the precursors deposit a layer of atoms onto a semiconductor wafer. Surface reaction of organic compounds or metalorganics and nitrogen-containing precursors create conditions for crystalline growth. Aluminum precursors suitable for MOCVD include trimethylaluminum and triethylaluminum. Gallium precursors for MOCVD include trimethylgallium and triethylgallium. Indium precursors suitable for MOCVD include trimethylindium, triethylindium, di-isopropylmethylindium, and ethyldimethylindium. Nitrogen precursors suitable for MOCVD include Ammonium, phenyl hydrazine, dimethyl hydrazine, tertiary butyl amine, and ammonia. Boron precursors include diborane, boronchloride, 1,3,5-tri(N-methyl) borazine. The molar ratio of Group V precursor (e.g., ammonia) to Group III precursor (e.g., trimethyl gallium) may be between 1 to 10000, preferably between 100 to 1000.

In some embodiments, the crystalline or amorphous semiconductor nitride layer comprises aluminum nitride. In some embodiments, the crystalline or amorphous semiconductor nitride layer comprises boron nitride. Aluminum nitride and boron nitride are advantageous since these materials exhibit high thermal stability. In some embodiments, the crystalline semiconductor nitride layer comprises indium nitride. In some embodiments, the crystalline semiconductor nitride layer comprises gallium nitride. In some embodiments, the crystalline semiconductor may contain the mixture of Ga, In, Al nitride, like GaInAlN, GaInAlBN. In some embodiments, the crystalline semiconductor may contain mixed layers of AlN, GaN, InN, or BN. The employment of different layers provides process integration advantages, like film stress management and diffusion barrier. An example is GaN/AlN/Si, where, AlN is a seed layer for GaN growth and it also blocks Ga diffusion into Si substrates.

A MOCVD reactor comprises a chamber comprising reactor walls, liner, a susceptor, gas injection units, and temperature control units. The parts of the reactor are made of materials resistant to and non-reactive with the precursor materials. To prevent overheating, cooling water may be flowing through the channels within the reactor walls. A substrate sits on a susceptor which is at a controlled temperature. The susceptor is made from a material resistant to the metalorganic compounds used, such as SiC or graphite. For growing nitrides and related materials, a special coating on the graphite susceptor may be used to prevent corrosion by ammonia ($NH_3$) gas. Reactive gas is introduced by an inlet that controls the ratio of precursor reactants. A wide bandgap material comprising a Group IIIA nitride may be deposited to a thickness between about 1 nanometer and about 2000 nanometers, or between about 5 nanometers and about 2000 nanometers, or between about 5 nanometers and about 1000 nanometers, or between about 5 nanometers and about 500 nanometers, or between about 5 nanometers and about 200 nanometers, such as between about 10 nanometers and about 100 nanometers by MOCVD on a high resistivity semiconductor handle substrate. The growth temperature may be between about 600° C. and about 1200° C., such as between about 800° C. and about 1200° C., preferably between about 1000° C. and about 1150° C. The Group IIIA nitride may be formed under reduced pressure, such as between about $10^{-11}$ Torr (about $1 \times 10^{-9}$ Pa) to about 760 Torr (about 101 kPa), or between about 1 Torr (about 0.13 kPa) and about 400 Torr (about 53.3 kPa), preferably between about 10 Torr (about 1.33 kPa) and about 80 Torr (about 10.67 kPa).

After deposition of the wide bandgap layer 108, optionally a dielectric layer may be formed on top of the wide bandgap layer. In some embodiments, the dielectric layer comprises an oxide film or a nitride film. Suitable dielectric layers may comprise a material selected from among silicon dioxide, silicon nitride, hafnium oxide, titanium oxide, zirconium oxide, lanthanum oxide, barium oxide, and combinations thereof. In some embodiments, the dielectric layer comprises an oxide film. Such an oxide film may serve as a bonding surface with an optionally oxidized semiconductor device substrate and thus may be incorporated into the dielectric layer 104 in the final semiconductor-on-insulator composite structure 100. In some embodiments, the dielectric layer comprises silicon dioxide, which may be deposited by means known in the art, such as CVD oxide deposition. In some embodiments, the silicon dioxide layer thickness can be between about 100 nanometers to about 5 micrometers, such as between about 500 nanometers and about 2 micrometers, or between about 700 nanometers and about 1 micrometer.

After oxide deposition, wafer cleaning is optional. If desired, the wafers can be cleaned, for example, in a standard SC1/SC2 solution. Additionally, the wafers may be subjected to chemical mechanical polishing (CMP) to reduce the surface roughness, preferably to the level of $RMS_{2 \times 2 \ um2}$ is less than about 50 angstroms, even more preferably less than about 5 angstroms, wherein root mean squared $$R_q = \sqrt{\frac{1}{n} \sum_{i=1}^{n} y_i^2},$$

the roughness profile contains ordered, equally spaced points along the trace, and $y_i$ is the vertical distance from the mean line to the data point.

The semiconductor handle substrate 102, e.g. a single crystal semiconductor handle wafer such as a single crystal silicon handle wafer, prepared according to the method described herein to comprise a wide bandgap layer 108 and, optionally, an oxide film, is next bonded a semiconductor donor substrate, e.g., a single crystal semiconductor donor wafer, which is prepared according to conventional layer transfer methods. That is, the single crystal semiconductor donor substrate, e.g., a single crystal semiconductor wafer, may be subjected to standard process steps including oxidation, implant, and post implant cleaning. Accordingly, a semiconductor donor substrate, such as a single crystal semiconductor wafer of a material that is conventionally used in preparation of multilayer semiconductor structures, e.g., a single crystal silicon donor wafer, that has been etched and polished and optionally oxidized, is subjected to ion implantation to form a damage layer in the donor substrate. In some embodiments, the semiconductor donor substrate comprises a dielectric layer. Suitable dielectric layers may comprise a material selected from among silicon dioxide, silicon nitride, hafnium oxide, titanium oxide, zirconium oxide, lanthanum oxide, barium oxide, and a combination thereof. In some embodiments, the dielectric layer comprises an oxide layer having a thickness from about 10 nanometers to about 500 nanometers, such as between about 100 nanometers and about 400 nanometers.

Ion implantation may be carried out in a commercially available instrument, such as an Applied Materials Quantum II. Implanted ions include He, H, $H_2$, or combinations thereof. Ion implantation is carried out as a density and duration sufficient to form a damage layer in the semiconductor donor substrate. Implant density may range from about $10^{12}$ ions/cm$^2$ to about $10^{16}$ ions/cm$^2$. Implant energies may range from about 1 keV to about 3,000 keV. In some embodiments it may be desirable to subject the single crystal semiconductor donor wafers, e.g., single crystal silicon donor wafers, to a clean after the implant. In some preferred embodiments, the clean could include a Piranha clean followed by a DI water rinse and SC1/SC2 cleans.

In some embodiments, the ion-implanted and optionally cleaned single crystal semiconductor donor substrate is subjected to oxygen plasma and/or nitrogen plasma surface activation. In some embodiments, the oxygen plasma surface activation tool is a commercially available tool, such as those available from EV Group, such as EVG® 810LT Low Temp Plasma Activation System. The ion-implanted and optionally cleaned single crystal semiconductor donor wafer is loaded into the chamber. The chamber is evacuated and backfilled with $O_2$ to a pressure less than atmospheric to thereby create the plasma. The single crystal semiconductor donor wafer is exposed to this plasma for the desired time, which may range from about 1 second to about 120 seconds. Oxygen plasma surface oxidation is performed in order to render the front surface of the single crystal semiconductor donor substrate hydrophilic and amenable to bonding to a single crystal semiconductor handle substrate prepared according to the method described above.

The hydrophilic front surface layer of the single crystal semiconductor donor substrate and the front surface of the single crystal semiconductor handle substrate, which is optionally oxidized, are next brought into intimate contact to thereby form a bonded structure. Since the mechanical bond is relatively weak, the bonded structure is further annealed to solidify the bond between the donor wafer and the handle wafer. In some embodiments of the present invention, the bonded structure is annealed at a temperature sufficient to form a thermally activated cleave plane in the single crystal semiconductor donor substrate. An example of a suitable tool might be a simple Box furnace, such as a Blue M model. In some preferred embodiments, the bonded structure is annealed at a temperature of from about 200° C. to about 350° C., from about 225° C. to about 325° C., preferably about 300° C. Thermal annealing may occur for a duration of from about 0.5 hours to about 10 hour, preferably a duration of about 2 hours. Thermal annealing within these temperatures ranges is sufficient to form a thermally activated cleave plane. After the thermal anneal to activate the cleave plane, the bonded structure may be cleaved.

After the thermal anneal, the bond between the single crystal semiconductor donor substrate and the single crystal semiconductor handle substrate is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the semiconductor donor wafer, thereby leaving a semiconductor device layer, preferably a silicon device layer, on the semiconductor-on-insulator composite structure.

After cleaving, the cleaved structure is subjected to a high temperature anneal in order to further strengthen the bond between the transferred device layer and the single crystal semiconductor handle substrate. An example of a suitable tool might be a vertical furnace, such as an ASM A400. In some preferred embodiments, the bonded structure is annealed at a temperature of from about 1000° C. to about 1200° C., preferably at about 1000° C. Thermal annealing may occur for a duration of from about 0.5 hours to about 8 hours, preferably a duration of about 4 hours. Thermal annealing within these temperatures ranges is sufficient to strengthen the bond between the transferred device layer and the single crystal semiconductor handle substrate.

After the cleave and high temperature anneal, the bonded structure may be subjected to a cleaning process designed to remove thin thermal oxide and clean particulates from the surface. In some embodiments, the single crystal semiconductor device layer may be brought to the desired thickness and smoothness by subjecting to a vapor phase HCl etch process in a horizontal flow single wafer epitaxial reactor using $H_2$ as a carrier gas. In some embodiments, an epitaxial layer may be deposited on the transferred device layer. The finished SOI wafer comprises the semiconductor handle substrate, the Group IIIA nitride layer, the dielectric layer (e.g., buried oxide layer), and the semiconductor device layer, may then be subjected to end of line metrology inspections and cleaned a final time using typical SC1-SC2 process.

According to the present invention, and with reference to FIG. 3, a semiconductor-on-insulator composite structure 100 is obtained with the wide bandgap layer 108 forming an interface with a high resistivity substrate 102 and with a dielectric layer 104. The dielectric layer 104 is in interface with a semiconductor device layer 106. The dielectric layer 104 may comprise a buried oxide, or BOX. The wide bandgap layer 108 comprises a semiconductor nitride, e.g., a Group IIIA nitride, in interface with the dielectric layer 104 in a semiconductor-on-insulator composite structure 100 can be effective for preserving charge trapping efficiency of the films during high temperature treatments.

Having described the invention in detail, it will be apparent that modifications and variations are possible without departing from the scope of the invention defined in the appended claims.

EXAMPLES

The following non-limiting examples are provided to further illustrate the present invention.

Figure 4:
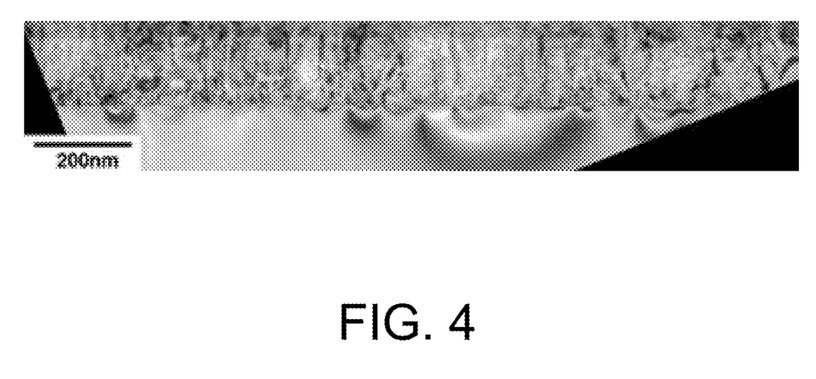
FIG. 4 is an XTEM image of aluminum nitride grown on a silicon substrate by metalorganic chemical vapor deposition (MOCVD).

Example 1. Silicon-on-Insulator Structure Comprising Aluminum Nitride Charge Trapping Layer A silicon-on-insulator structure 100 of the invention is depicted in FIG. 3. A thin crystalline charge trapping layer 108 comprising aluminum nitride (100 nm) is grown by MOCVD on top of high resistivity silicon handle substrate 102 with the growth temperature of 1100° C. Aluminum nitride is formed under reduced pressure of 40 Torr. This substrate was used in the production of a silicon-on-insulator structure 100 further comprising an insulator layer of silicon dioxide 104 and a silicon device layer 106. FIG. 4 depicts the bright field cross-section TEM image of the 100 nm aluminum nitride layer grown on the silicon substrate by MOCVD. The dislocation network creates a high density of potential charge traps. About 7600 angstroms $SiO_2$, as part of the insulator layer 104, is then deposited on top of AlN layer 108. A conventional donor wafer with about 2400 angstroms $SiO_2$ can then be implanted and bonded to the handle substrate by conventional techniques. The SOI structure is then heat treated, cleaved, and gone through multiple thermal processes to reach the end of line with standard process flow.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. A method of forming a multilayer structure, the method comprising:

forming a crystalline semiconductor nitride layer on a front surface of a silicon wafer handle substrate, wherein the crystalline semiconductor nitride layer is selected from the group consisting of aluminum nitride, boron nitride, indium nitride, gallium nitride, aluminum gallium nitride, aluminum gallium indium nitride, aluminum gallium indium boron nitride, and combinations thereof and further wherein the crystalline semiconductor nitride layer is formed by metalorganic chemical vapor deposition occurring by a reaction between an organic compound or a metalorganic compound and a nitrogen-containing precursor and wherein the silicon wafer handle substrate comprises two major, generally parallel surfaces, one of which is the front surface of the silicon wafer handle substrate and the other of which is a back surface of the silicon wafer handle substrate, a circumferential edge joining the front and back surfaces of the silicon wafer handle substrate, and a bulk region between the front and back surfaces of the silicon wafer handle substrate, wherein the silicon wafer handle substrate has a minimum bulk region resistivity of at least about 500 ohm-cm;

forming a silicon dioxide layer having a thickness between about 500 nanometers and about 2 micrometers in interfacial contact with the crystalline semiconductor nitride layer; and bonding a dielectric layer in interfacial contact with a front surface of a semiconductor donor substrate to the silicon dioxide layer in interfacial contact with the crystalline semiconductor nitride layer to thereby form a bonded structure, wherein the semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate.

2. The method of claim 1 wherein the silicon wafer handle substrate is sliced from a single crystal silicon ingot grown by the Czochralski method or the float zone method.

3. The method of claim 1 wherein the silicon wafer handle substrate has a bulk resistivity between about 500 Ohm-cm and about 100,000 Ohm-cm.

4. The method of claim 1 wherein the silicon wafer handle substrate has a bulk resistivity between about 1000 Ohm-cm and about 100,000 Ohm-cm.

5. The method of claim 1 wherein the silicon wafer handle substrate has a bulk resistivity between about 1000 Ohm-cm and about 10,000 Ohm-cm.

6. The method of claim 1 wherein the silicon wafer handle substrate has a bulk resistivity between about 2000 Ohm-cm and about 10,000 Ohm-cm.

7. The method of claim 1 wherein the silicon wafer handle substrate has a bulk resistivity between about 3000 Ohm-cm and about 10,000 Ohm-cm.

8. The method of claim 1 wherein the silicon wafer handle substrate has a bulk resistivity between about 3000 Ohm-cm and about 5,000 Ohm-cm.

9. A method of forming a multilayer structure, the method comprising:
forming an amorphous semiconductor nitride layer on a front surface of a silicon wafer handle substrate, wherein the amorphous semiconductor nitride is selected from the group consisting of aluminum nitride, boron nitride, indium nitride, gallium nitride, aluminum gallium nitride, aluminum gallium indium nitride, aluminum gallium indium boron nitride, and combinations thereof and further wherein the amorphous semiconductor nitride layer is formed by metalorganic chemical vapor deposition occurring by a reaction between an organic compound or a metalorganic compound and a nitrogen-containing precursor and wherein the silicon wafer handle substrate comprises two major, generally parallel surfaces, one of which is the front surface of the silicon wafer handle substrate and the other of which is a back surface of the silicon wafer handle substrate, a circumferential edge joining the front and back surfaces of the silicon wafer handle substrate, and a bulk region between the front and back surfaces of the silicon wafer handle substrate, wherein the silicon wafer handle substrate has a minimum bulk region resistivity of at least about 500 ohm-cm:
forming a silicon dioxide layer having a thickness between about 500 nanometers and about 2 micrometers in interfacial contact with the amorphous semiconductor nitride layer; and
bonding a dielectric layer in interfacial contact with a front surface of a semiconductor donor substrate to the silicon dioxide layer in interfacial contact with the crystalline semiconductor nitride layer to thereby form a bonded structure, wherein the semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate.

10. The method of claim 1 wherein the crystalline semiconductor nitride layer comprises aluminum nitride.

11. The method of claim 1 wherein the crystalline semiconductor nitride layer comprises boron nitride.

12. The method of claim 1 wherein the crystalline semiconductor nitride layer comprises indium nitride.

13. The method of claim 1 wherein the crystalline semiconductor nitride layer comprises gallium nitride.

14. The method of claim 1 wherein the crystalline semiconductor nitride layer has an average thickness of between about 1 nanometer and about 2000 nanometers.

15. The method of claim 1 wherein the crystalline semiconductor nitride layer has an average thickness of between about 5 nanometers and about 1000 nanometers.

16. The method of claim 1 wherein the crystalline semiconductor nitride layer has an average thickness of between about 5 nanometers and about 500 nanometers.

17. The method of claim 1 wherein the crystalline semiconductor nitride layer has an average thickness of between about 5 nanometers and about 200 nanometers.

18. The method of claim 1 wherein the semiconductor donor substrate comprises a silicon wafer sliced from a single crystal silicon ingot grown by the Czochralski method or the float zone method.

19. The method of claim 1 wherein the semiconductor donor substrate comprises a silicon wafer sliced from a single crystal silicon ingot grown by the Czochralski method.

20. The method of claim 1 wherein the dielectric layer in interfacial contact with the semiconductor donor substrate is selected from the group consisting of silicon dioxide, silicon nitride, hafnium oxide, titanium oxide, zirconium oxide, lanthanum oxide, barium oxide, and any combination thereof.

21. The method of claim 1 further comprising heating the bonded structure at a temperature and for a duration sufficient to strengthen the bond between the dielectric layer in interfacial contact with the semiconductor donor structure and silicon dioxide layer in interfacial contact with the crystalline semiconductor nitride layer.

22. The method of claim 1 wherein the semiconductor donor substrate comprises an ion implanted damage layer.

23. The method of claim 22 further comprising mechanically cleaving the bonded structure at the ion implanted damage layer of the semiconductor donor substrate to thereby prepare a cleaved structure comprising the silicon wafer handle substrate, the crystalline semiconductor nitride layer in contact with the front surface of the silicon wafer handle substrate, the silicon dioxide layer in interfacial contact with the crystalline semiconductor nitride layer, the dielectric layer in contact with the silicon dioxide layer, and a semiconductor device layer in contact with the dielectric layer.

24. The method of claim 23 further comprising heating the cleaved structure at a temperature and for a duration sufficient to strengthen the bond between the dielectric layer and the silicon dioxide layer.

* * * * *